United States Patent [19]

Wells

[11] Patent Number: 4,745,626
[45] Date of Patent: May 17, 1988

[54] DECODER

[75] Inventor: Brian D. Wells, Stockport, Great Britain

[73] Assignee: International Computers Limited, London, England

[21] Appl. No.: 21,914

[22] Filed: Mar. 4, 1987

[30] Foreign Application Priority Data

Mar. 12, 1986 [GB] United Kingdom ............... 8606028

[51] Int. Cl.$^4$ .............................................. H04L 27/22
[52] U.S. Cl. ........................................ 375/87; 375/94; 360/42
[58] Field of Search ................. 375/55, 87, 94, 95; 360/42, 51; 328/63, 72; 307/511, 513, 518

[56] References Cited

U.S. PATENT DOCUMENTS

| | | | |
|---|---|---|---|
| 4,525,848 | 6/1985 | Simpson ............................. | 375/87 |
| 4,542,420 | 9/1985 | Kozlik et al. ...................... | 375/94 |
| 4,608,702 | 8/1986 | Hirzel et al. ...................... | 328/63 |
| 4,637,037 | 1/1987 | Chao .................................. | 329/104 |

Primary Examiner—Michael A. Masinick
Assistant Examiner—Stephen Chin
Attorney, Agent, or Firm—Lee, Smith & Zickert

[57] ABSTRACT

A decoder is described for a self-clocking code, e.g. a bi-frequency Manchester code. Transitions are detected in the encoded data and are clocked into a shift register by a clock having a frequency equal to a multiple of the data bit rate. A logic network is connected to the shift register so as to detect combinations of transitions representing encoded data bits "0" and "1". The logic network includes OR gate funnels which detect the transitions in a range of possible positions in the shift register, so as to allow for jitter in the input data signal. The circuit allows encoded data to be correctly decoded in the presence of jitter without the necessity for using a phase-locked loop.

9 Claims, 2 Drawing Sheets

DECODER

This invention relates to a decoder for data encoded by a self-clocking code. The invention is particularly although not exclusively concerned with a decoder for Manchester encoded data.

In a self-clocking code, date is encoded in such a way that the encoded signal contains both data and clock information, so that it is not necessary to transmit a separate clock signal. For example, in one form of Manchester code, referred to as Manchester bi-frequency code, the data is encoded as a succession of bit cells, with a transition at the boundary between each adjacent pair of cells. Bit cells representing zero contain no further transitions while those representing one contain a further transition at the mid point.

Signals transmitted over a transmission line generally suffer from jitter, i.e. variations in the arrival time of the signals as a result of variations in the transmission characteristics of the line. Such jitter creates problems in decoding self-clocking codes. One known solution to this problem is to use a phase-locked loop for locking on to the incoming data so as to eliminate the jitter. However, phase-locked loops are complex and expensive.

The object of the present invention is to provide a way of decoding self-clocking codes in the presence of jitter without using a phase-locked loop.

SUMMARY OF THE INVENTION

According to the invention there is provided a decoder for decoding data in a self-clocking code, comprising:
(a) a shift register,
(b) means for clocking the shift register at a frequency equal to a multiple of the bit rate of the encoded data,
(c) means for injecting a bit into the shift register to represent each transition in the encoded data, and
(d) a logic network for detecting in the shift register a plurality of bits representing the transitions in a bit cell of the encoded data, the logic network being arranged to detect at least one of these bits in any one of a range of stages of the shift register, so as to allow for variations in the timing of the transitions as a result of jitter.

BRIEF DESCRIPTION OF DRAWINGS

One decoder in accordance with the invention will now be described by way of example with reference to the accompanying drawings.

DESCRIPTION OF AN EMBODIMENT OF THE INVENTION

Figure 1:
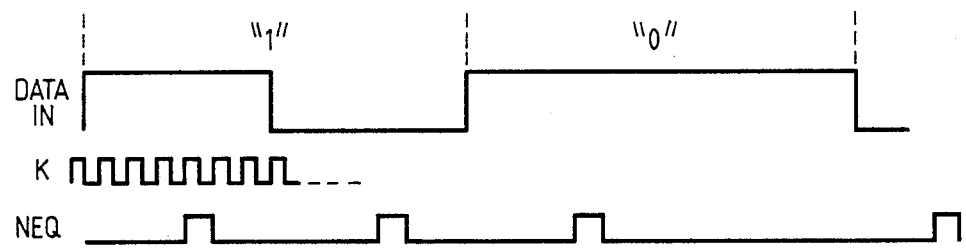
FIG. 1 shows a Manchester bi-frequency encoded data signal, and also the waveforms of other signals in the decoder.

FIG. 1 shows one form of self-clocking code, referred to as a Manchester bi-frequency code. The encoded signal consists of a succession of bit cells, representing the binary digits "0" and "1". There is a transition in the signal level from high to low or vice versa at the boundary between each adjacent pair of bit cells. A cell representing a "1" has an additional transition at its mid point, while a cell representing "0" has no additional transition. In this example, it is assumed that the data rate of the input data is 3 million bits per second, so that each bit cell is 333.3 nanoseconds in duration.

Figure 3:
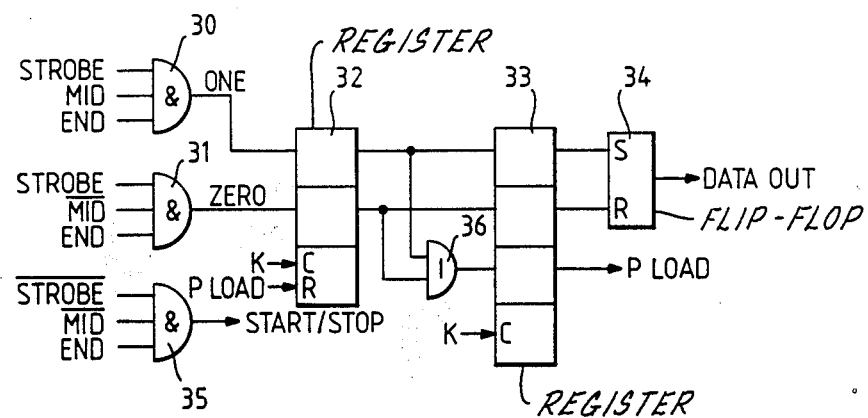
FIGS. 2 and 3 are a logic circuit diagram of the decoder.
Figure 2:
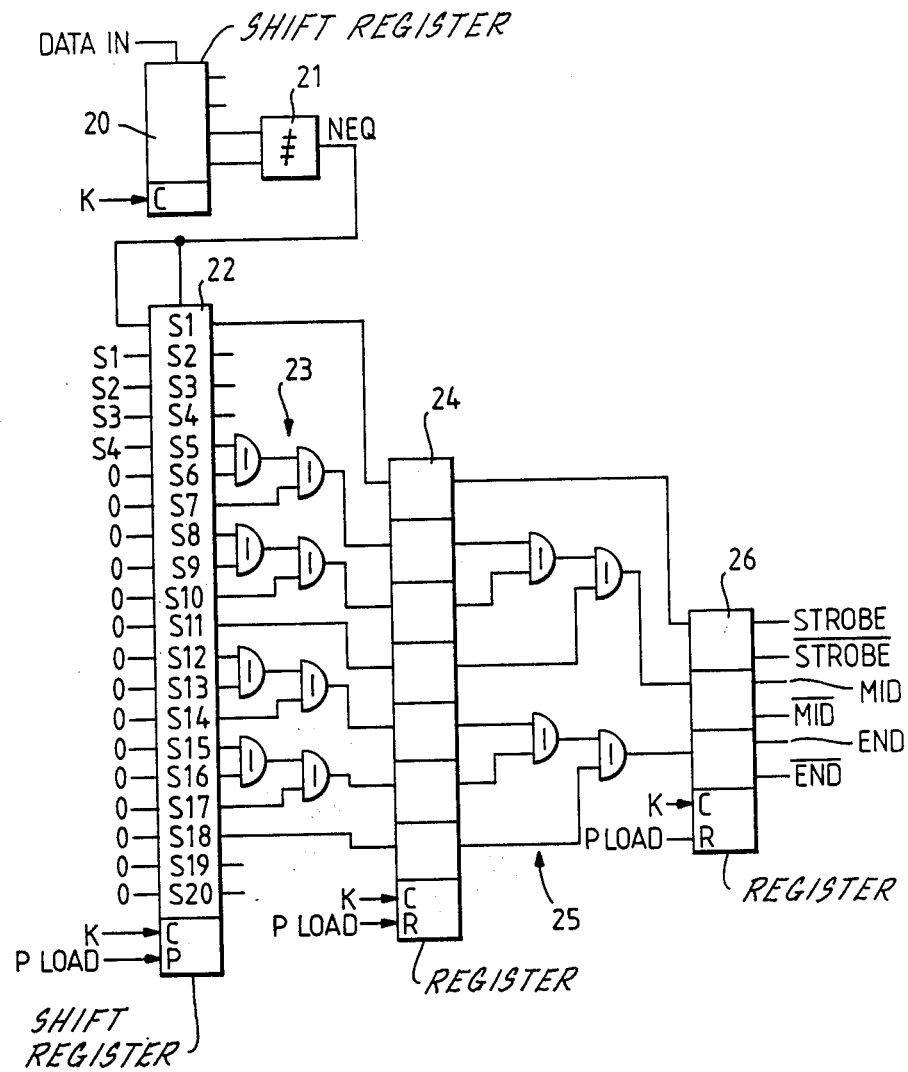

FIGS. 2 and 3 show a decoder for decoding the data encoded in this form.

Referring to FIG. 2, the encoded data is fed to the serial data input of a four-stage shift register 20 which is clocked by a clock signal K having a frequency of 42 Megahertz, i.e. 14 times the data rate of the input data. The shift register 20 thus samples the input data every 23.8 nanoseconds, so that a series of binary ones is shifted into the shift register while the input signal is high, and a series of binary zeros is shifted in while the input signal is low.

The purpose of the first two stages of the shift register 20 is to "de-boggle" the input data, i.e. to ensure that the data is fully synchronised to the clock K.

The outputs of the last two stages of the shift register 20 are fed to the inputs of a non-equivalence gate 21, to produce a signal NEQ whenever a transition occurs in the input data. For example, FIG. 1 shows pulses in the signal NEQ corresponding to the transitions in the encoded data input signal DATAIN. It should be noted that each of these pulses is delayed by four clock beats with respect to the corresponding transition in the data input signal, as a result of the four-beat delay in the shift register 20.

The signal NEQ is fed to the serial data input of another shift register 22, having twenty stages S1–S20. This shift register is clocked by the same clock signal K. Each transition in the input data causes a binary "1" to be injected into the first stage S1, and this is then shifted through the other stages S2–S20. Thus, at any given time, the contents of the shift register 22 represent the transitions in a 476 nanosecond portion of the input data signal. The register is therefore long enough to hold a complete bit cell (333.3 nanoseconds) of the data signal, with an allowance for jitter.

For an ideal signal with no jitter, when the bit representing the transition at the trailing edge of a bit cell is in stage S1, the bit representing the transition at the leading edge of the cell will be in stage S15 and the bit representing the transition (if any) at the mid-point of the cell will be in stage S8. However, because of jitter and sampling errors in the de-boggie stages of shift register 20, the actual positions of these transitions may vary by one or more stages from the ideal positions.

The outputs of selected stages of the shift register 22 are fed to a logic network consisting of OR gates 23, a register 24, OR gates 25 and a register 26 connected as shown. The registers 24 and 26 are both clocked by the signal K so that they are loaded at each clock beat. The outputs of register 26 provide signals STROBE, MID and END, and their inverses.

STROBE is produced whenever a binary "1" occurs in stage S1 of the shift register 22, and is taken to indicate a transition at the trailing edge of a bit cell.

MID is derived from a funnel of OR gates 23,25 connected to the outputs of stages S5–S11 of the shift register, and hence MID is produced whenever a binary "1" occurs anywhere in this range of stages. MID therefore indicates a transition at the ideal mid-point to the data cell, or at any of a range of positions on either side of this ideal position.

Similarly, END is derived from a funnel of OR gates 23,25 connected to the outputs of stages S12–S18 of the shift register, so that END is produced whenever a binary "1" occurs anywhere in this range of stages. END therefore indicates a transition at the ideal leading edge of the bit cell or at any of a range of positions on either side.

A bit cell representing a Manchester-encoded "1" therefore causes STROBE, MID and END all to be true simultaneously. This condition is detected by an AND gate 30 (FIG. 3), producing a signal ONE. Similarly, a bit cell representing a Manchester-encoded "0" causes STROBE and END to be true while MID is false. This condition is detected by an AND gate 31, producing a signal ZERO.

The signals ONE and ZERO are loaded into a register 32 at the next beat of clock K, and then transferred to another register 33 at the next again clock beat, where they control the set and reset inputs of an SR-type Flip-flop 34. The output of this flip-flop is a signal DATAOUT which represents the decoded data signal in non-return-to-zero form.

It can be seen that, because MID and END are derived from funnels of OR gates each connected to a range of stages of the shift register 22, the data will be correctly decoded even in the presence of jitter causing the transitions to deviate from their ideal positions.

Referring again to FIG. 3, if STROBE and MID are both false while END is true, another AND gate 35 is enabled, producing a signal START/STOP. This indicates either a start signal in the input data (represented by a bit cell containing only a single transition) or the end of a sequence of data bits.

Also as shown in FIG. 3, the outputs of the register 32, representing the signals ONE and ZERO delayed by one clock beat, are combined in an OR gate 36 and the result is loaded into register 33 at the next clock beat to produce a signal PLOAD. This signal indicates that a Manchester-encoded data cell representing either "0" or "1" has been decoded.

As shown in FIG. 2, PLOAD is fed to a control input P of the register 22, switching it from its shift mode into its parallel load mode. This causes the register 22 to be loaded, in parallel at the next clock beat. As can be seen from FIG. 2, zeros are loaded into stages S6–S20. This clears the remnants of the data bit cell that has just been decoded. At the same time, the outputs of stages S1–S4 are loaded into stages S2–S5, and NEQ is loaded into S1. This causes the bit representing the transition at the trailing edge of the bit cell to be shifted one stage down the register. This trailing edge bit is not cleared because it is also part of the next bit cell to be decoded.

PLOAD is also fed to reset inputs R of the registers 24, 26 and 32, so as to clear them in preparation for the reception of the next Manchester-encoded bit cell.

It should be noted that the logic network described above consists of four separate logic stages (OR gates 23, OR gates 25, AND gates 30,31 and OR gate 36) each of which has its output clocked into a register 24,26 32,33. The operation of these four logic stages is pipelined, since they act simultaneously on data from four successive states of the shift register. The ability to pipeline the logic in this way is important, since it allows a relatively fast clock K to be used; i.e. the period of the clock K can be considerably shorter than the total delay through the logic network.

The decoder described above is capable of correctly decoding Manchester-encoded data with jitter variations of up to 2 clock beats (47.6 nanoseconds) in either direction, allowing a further one clock beat in either direction for synchronisation errors in the de-boggle stages of shift register 20.

In other decoders in accordance with the invention, different degrees of jitter cover can be obtained by changing the clock frequency and varying the number of stages in the shift register 22 and the connections of the OR gate funnels. In general, if the clock frequency is n times the input data rate, then the ideal positions for detecting the leading edge, mid-point, and trailing edge transitions will be in stages $n+1$, $n/2+1$ and 1 of the shift register. It is therefore possible to use OR gate funnels connected to $n/2+1$ stages of the shift register, to allow transitions to be detected $n/4$ clock beats on either side of the ideal positions. Allowing for a possible error of one clock beat in either direction from synchronisation errors in the de-boggle stages of shift register 20, this means that the encoder can handle jitter of up to $n/4-1$ clock beats in either direction.

The decoder described above can also be modified by using a different clock signal, faster than the clock K. to clock the input shift register 20. This reduces the de-boggie errors.

The decoder described above can readily be implemented as a very-large-scale integrated (VLSI) circuit.

I claim:

1. A decoder for decoding an encoded data in a self-clocking code, comprising:
   (a) a shift register,
   (b) means for clocking the shift register at a frequency equal to a multiple of the bit rate of the encoded data,
   (c) means for injecting a bit into the shift register to represent each transition in the encoded data, and
   (d) a logic network for detecting in the shift register a plurality of bits representing the transitions in a bit cell of the encoded data, the logic network including at least one OR-logic circuit for detecting one of these bits in any one of a plurality of adjacent stages of the shift register, so as to allow for variations in the timing or the transitions as a result of jitter.

2. A decoder according to claim 1, for decoding a Manchester bi-frequency encoded signal comprising a succession of bit cells with a transition at the boundary between each adjacent pair of cells and a further transition at the mid-point of each cell of one particular binary value.

3. A decoder according to claim 1 wherein the logic network comprises:
   (a) means for producing a strobe signal whenever a bit representing a transaction occurs in a predetermined stage of the shift register,
   (b) a first OR-logic funnel for detecting the presence of a bit representing a transition in any of a first plurality of adjacent stages of the shift register, and
   (c) a second OR-logic funnel for detecting the presence or a bit representing a transition in any of a second plurality of adjacent stages of the shift register.

4. A decoder according to claim 3 wherein said first plurality of stages is centred on a stage of the shift register $n/2$ stages from said predetermined stage in the direction of shifting, and said second range of stages is centred on a stage of the shift register n stages from said predetermined stage in the direction of shifting, where n is the ratio between the frequency of clocking the shift register and the bit rate of the encoded data.

5. A decoder according to claim 4 wherein each of said first and second pluralities of stages includes $n/2+1$ stages.

6. A decoder according to claim 3 wherein the logic network further includes means for combining the strobe signal with the outputs of the first and second logic funnels, to produce a signal indicating the presence of a bit cell of one particular binary value, and means for combining the strobe signal with the output of the second logic funnel and the inverse output of the first logic funnel to produce a signal indicating the presence of a bit cell of the other binary value.

7. A decoder according to claim 1 wherein detection by the logic network of bits representing the transitions in a bit cell of the encoded data causes selected stages of the shift register to be reset so as to clear the bits representing the transitions in that cell, other than that representing the transition at the trailing edge of that cell.

8. A decoder according to claim 1 wherein the logic network comprises a plurality of separate logic stages connected by registers clocked in synchronism with the shift register, whereby the separate logic stages operate in a pipelined manner.

9. A decoder according to claim 1 including a further shift register for synchronising the encoded data before applying it to the first-mentioned shift register.

* * * * *